United States Patent [19]

Bernhardt

[11] 3,952,603
[45] Apr. 27, 1976

[54] PUSHBUTTON SYSTEM, IN PARTICULAR FOR A PUSHBUTTON OPERATED CAR RADIO RECEIVER

[75] Inventor: Werner Bernhardt, Wetzlar, Germany

[73] Assignee: U.S. Philips Corporation, New York, N.Y.

[22] Filed: Apr. 18, 1974

[21] Appl. No.: 461,974

[30] Foreign Application Priority Data

Apr. 27, 1973 Germany............................ 2321308

[52] U.S. Cl.............................. 74/10.33; 74/10.27; 74/10.35
[51] Int. Cl.² ........................................ F16H 38/18
[58] Field of Search............. 74/10.33, 10.31, 10.29, 74/10.27, 10.37, 10.35

[56] References Cited
UNITED STATES PATENTS

| 3,463,017 | 8/1967 | Stamm et al. | 74/10.33 |
| 3,581,582 | 6/1971 | Schijven | 74/10.33 |
| 3,648,526 | 3/1972 | Repay | 74/10.27 |
| 3,722,299 | 3/1973 | Knight | 74/10.33 |

Primary Examiner—Benjamin W. Wyche
Assistant Examiner—Randall Heald
Attorney, Agent, or Firm—Frank R. Trifari; David R. Treacy

[57] ABSTRACT

A pushbutton system for a car radio receiver, comprising pairs of selector drive rods alternately engaged by a common button. A pawl drives a sequencing catch. The pivot point of the pawl is shifted when re-setting a drive rod so that sequencing is inhibited. The pivot point is restored to normal only upon full depression of the button.

7 Claims, 9 Drawing Figures

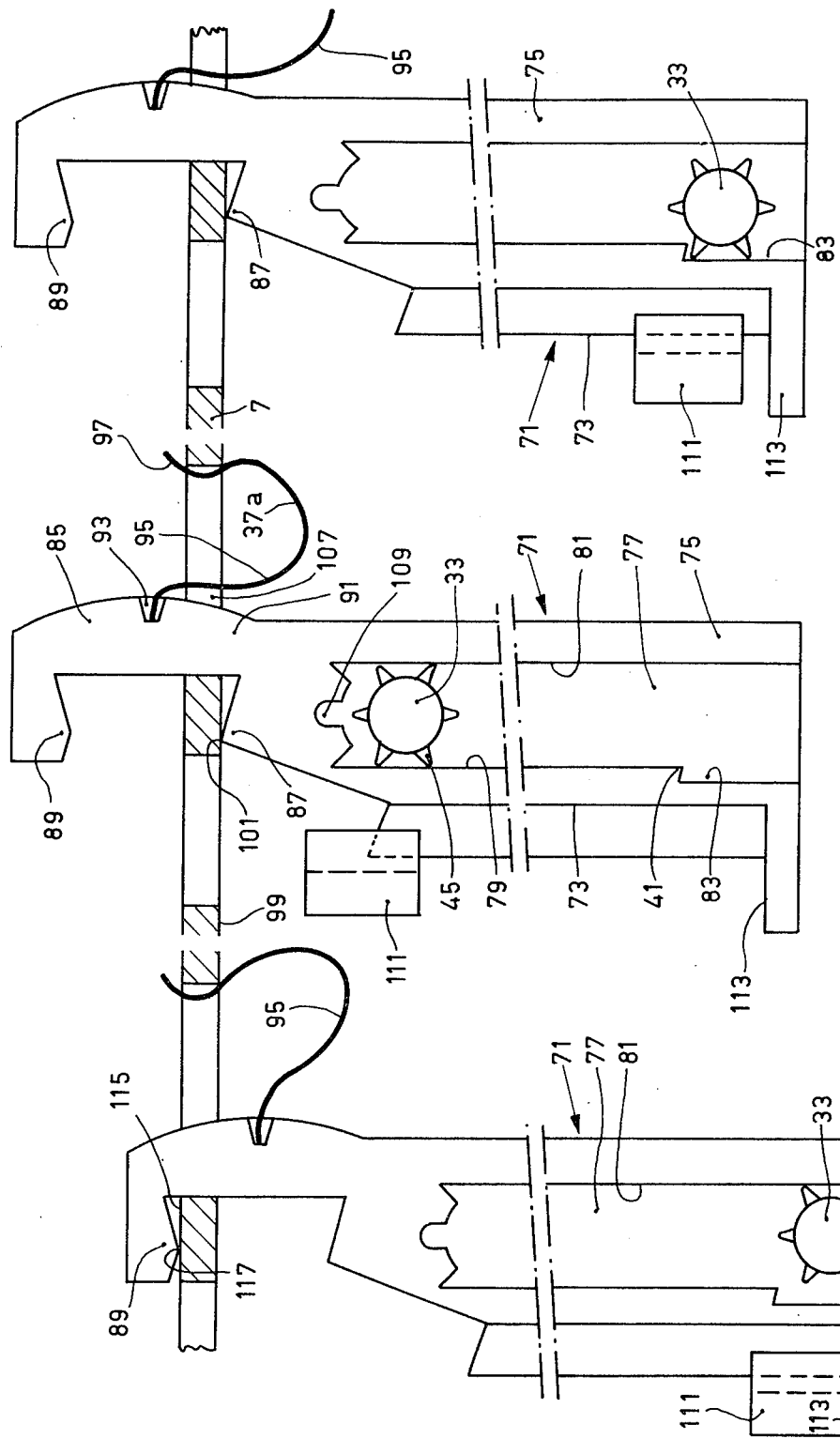

PUSHBUTTON SYSTEM IN PARTICULAR FOR A PUSHBUTTON OPERATED CAR RADIO RECEIVER

BACKGROUND OF THE INVENTION

The invention relates to a pushbutton system, in particular for a pushbutton-operated car radio receiver, in which each pushbutton is capable of operating two drive rods, each of the said drive rods in turn driving a common tuning mechanism. At least two drive rods are alternately engaged and operated by the associated common button by means of a sequencing mechanism which is controlled by this button. An engaging catch having the shape of a latch moves along with the button and can be laterally slid in a reciprocating manner. At the beginning of the depressing movement of the button, catch movement interrupts the coupling with the previously engaged drive rod and establishes the coupling with the other rod with the aid of a pushing gearwheel. The gearwheel moves with the button and controls the lateral movement of the latch; and is coupled to a drive gearwheel which is rotated upon each depressing movement by a drive pawl which engages therein, each one of said two drive rods consisting of two adjoining bars. The first bar supports a semi-circular adjusting member which can be fixed by the second bar, which can be slid out with respect to the first bar by pulling out the button. By sliding the second bar in again, the adjusting member is again locked. The drive pawl is provided with a guide slot between the oppositely arranged sides of which the drive gearwheel can rotate only in the region of a recess in one of the sides, in accordance with U.S. Pat. No. 3,581,582.

In this device automatic tuning to alternately two stations is obtained by means of each pushbutton, and preselection and changing of the two pushbutton tunings is thus also possible. However, careless operation during preselection may cause the mechanism to jam.

SUMMARY OF THE INVENTION

The object of the invention is to eliminate jamming and the effect of latch slipping.

According to the invention, the slotted drive pawl forms, in conjunction with the frame, two pivots which are situated one behind the other in the direction of the slot, a spring member engaging the drive pawl between the pivots such that during rotation about one pivot one side of said slot abuts against the drive gearwheel, while the other slot side abuts against the gearwheel during rotation about the other pivot. A further improvement can also be incorporated in the novel device so as to prevent disturbance caused by vibrations. This improvement consists in having teeth of the pushing gearwheel shaped such that cams on the latch, which cooperate with said teeth and which are provided on a line at right angles to the drive rods and through the gearwheel shaft, continuously engage the tooth flanks.

BRIEF DESCRIPTION OF THE DRAWING

The invention will be described in detail with reference to the accompanying drawings.

FIG. 4 is a plan view of a drive pawl according to the invention, FIGS. 5 and 6 show other positions of the drive pawl of FIG. 4, and FIGS. 7, 8 and 9 show a modified embodiment of a component of the device according to the FIGS. 1 and 4 in different positions.

DETAILED DESCRIPTION OF THE PREFERRED EMBODIMENT

Figure 1:
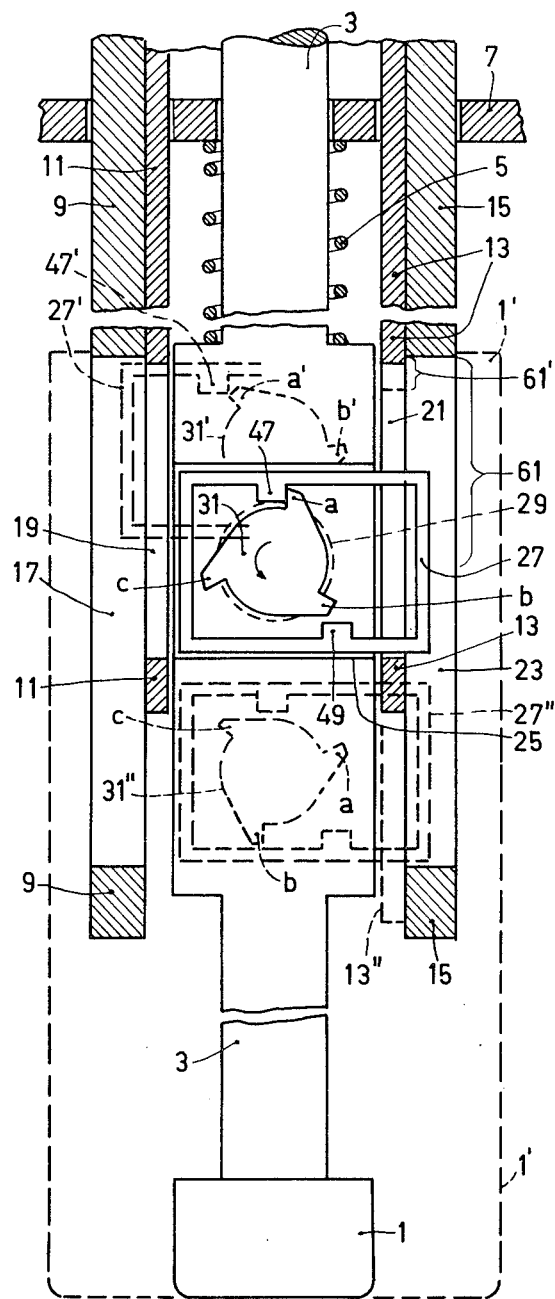
FIG. 1 is a sectional view of a pushbutton mechanism, comprising a pushbutton and two drive rods which are arranged on both sides thereof.
Figure 2:
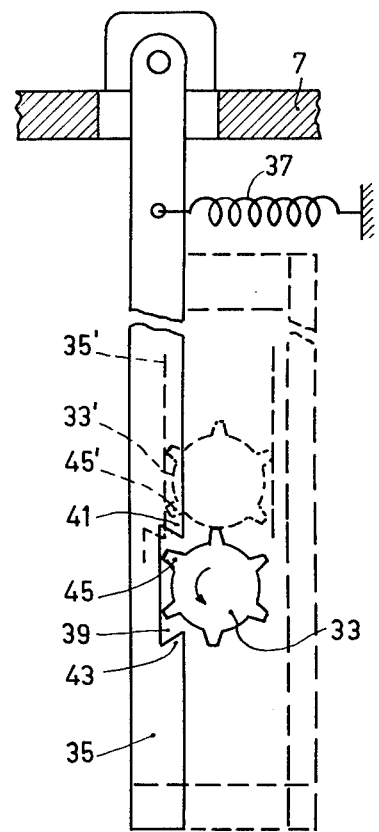
FIG. 2 is a plan view of a drive pawl according to the prior art which can be used in the device according to FIG. 1.

FIGS. 1 and 2 show a plan view of a pushbutton mechanism which is usually provided on the front of a car radio receiver. The complete pushbutton system usually consists of a number of similar pushbutton mechanisms which are adjacently arranged in parallel. The drive pawl according to FIG. 2 is generally arranged underneath the assembly of FIG. 1, and is separately shown merely for the sake of clarity.

The device shown comprises a pushbutton 1 which is secured on the foremost end (the lower end in FIG. 1) of a slidable pushbutton rod 3 which is made, for example, of a synthetic resin material. The pushbutton rod 3 is located in a frame 7 so as to be depressable against the force of a pressure spring 5. Mounted to be slidable in the frame 7 are two double metal drive rods, each consisting of two adjacent bars 9 and 11 and 13 and 15, respectively, the two double rods 9, 11 and 13, 15 being arranged on both sides of the pushbutton rod 3. The foremost ends of the drive rods are provided with elongated openings 17, 19, 21 and 23, respectively. The preferably widened center portion of the pushbutton rod comprises a wide transverse groove 25 which can be closed by a cover (not shown for the sake of clarity) and which constitutes a guide for a latch 27 — shown to be framelike in the present embodiment — which is movable in the transverse direction and which acts as a catch or engaging member. The latch 27 follows the sliding movement of the pushbutton rod 3, and its own lateral movement is controlled, as will yet be described, such that at each depressing movement of the button 1 a coupling is established between the pushbutton rod 3 and alternately one of the adjacently arranged double rods 9, 11 and 13, 15, the coupling with a rod being each time preceded by the disruption of the existing coupling with the other (double) drive rod, so that each time only one of the two drive rods is taken along.

Figure 3:
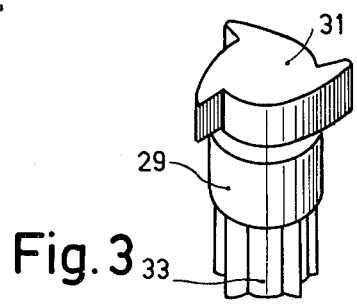
FIG. 3 is a perspective view of the combination of pushing gearwheel and drive gearwheel.

Journalled to be rotatable in a suitable opening in the bottom of the groove 25 is a gearwheel shaft 29 which is made, for example, of a synthetic resin material, and on which two gearwheels 31 and 33 are formed (see FIG. 3; the shaft is denoted by a broken line in FIG. 1). The gearwheel 31 which comprises three teeth $a$, $b$ and $c$ and which acts as a pushing gearwheel is situated in the space inside the frame-like latch 27, while the gearwheel 33 which is separately shown in FIG. 2 and which serves to drive the gearwheel 31 is provided with six teeth and projects from the drive rod 3 on the lower side. The drive gearwheel 33 is arranged to be level with a drive pawl 35 which is arranged directly below the pushbutton rod 3 and which is journalled to be pivotable over a small angle in the frame 7, the pawl being pulled against the gearwheel 33 by a tension spring 37.

FIG. 2 shows that pawl 35 is provided with a dovetail-like recess 39 between two cams 41 and 43 which can cooperate with the teeth of the drive gearwheel 33. As is shown in FIG. 2, this cooperation results in one of the teeth of the gearwheel 33 (denoted by 45 in FIG. 2) engaging the cam 41 at the beginning of the depressing movement of the pushbutton 1, so that the gearwheel 33 is forced to rotate counter-clockwise through approximately 60°. This can be readily seen from FIG. 2 in which the position 33' of the gearwheel 33 after commencement of the depressing movement of the button is denoted by a broken line. The pawl 35 is then shifted slightly to the left (position 35') and engages under spring pressure two teeth of the gearwheel 33 simultaneously, with the result that the latter is locked against further rotation to some extent. Complete locking is achieved by constructing the pawl 35 as a frame in the manner denoted in FIG. 2 by broken lines.

FIG. 1 shows that in the rest position of the button, prior to depression, one of the three teeth of the pushing gearwheel 31, i.e. the tooth a, abuts against a cam 47 which is formed on the inner side of the frame-like latch 27. During the rotation through approximately 60°, performed simultaneously by the gearwheel 31 and the gearwheel 33 during the displacement from the position which is denoted by a solid line to the position 33' which is denoted by a broken line in FIG. 2, the tooth a of the pushing gearwheel 31 pushes the cam 47 to the left, with the result that the latch 27 performs a combined movement which results in the position 27' denoted by a broken line in FIG. 1. FIG. 1 shows that the latch 27 — initially projecting to the right into the openings 21 and 23 of the right-hand drive rod — now projects to the left into the openings 17 and 19 of the double drive rod 9, 11 which is provided on the left. It will be obvious that when the rod 3 is pushed further by means of the button 1, the double drive rod 9, 11 will be engaged and taken along by the latch 27, with the result that the radio receiver in which the described device is incorporated is tuned in well-known manner to a preselected station by means of a semi-circular disc which is provided on the rod. When the pushbutton 1 is released, the rod 3 is returned to the rest position by the spring 5 and this is also effected — by means of a return spring which is not shown for the sake of clarity — with the double drive rod 9, 11. When the drive gearwheel 33 has returned in the rest position which is denoted in FIG. 2 by a solid line, two of the six teeth of the gearwheel 33 engage in the recess 39 without the rotary position of the gearwheel being changed; the tooth c of the pushing gearwheel 31 then abuts (see FIG. 4) against a second cam 49 which is formed on the inner side of the frame 27, the latter cam being provided on the opposite side of the shaft 29, viewed from the cam 47. FIG. 1 clearly shows that as a result of this arrangement of the cams 47 and 49 they alternately engage the teeth of the pushing gearwheel 31, so that when this gearwheel is rotated in the same direction, the latch 27 is alternately slid in opposite directions. Consequently, when the button 1 is depressed again, the latch 27 will assume the position shown in FIG. 1 with respect to pushbutton rod 3; it is obvious that the right-hand double rod 13, 15 will then be engaged and taken along when pushbutton rod 1 is pushed in further.

Provided in well-known manner on each of the rods 9 and 15 is a semicircular disc (not shown) which is rotatable and which can be fixed by means of the rod 11 and 13, respectively, the rotary position of each disc determining — by abutting against a trip or bascule which is coupled to the tuning mechanism of the receiver and causing this trip to take over the said rotary position — the tuning to be obtained by operation of the relevant rod. So as to change this tuning, the fixation of the disc must be temporarily shifted, and this is effected in known manner by pulling out the button 1.

If this is done in the position shown in FIG 1, the situation which is denoted by broken lines in the lower half of the figure arises. The frame-like latch 27 is displaced from the position 27 to the position 27" denoted by broken lines, while taking along the bar 13 which is slid to the position 13" (denoted by broken lines) with respect to the bar 15 which remained in place. One of the teeth of the drive gearwheel 33, also undergoing the shift, then stikes the foremost cam 43 of the pawl 35, and is thus rotated through approximately 60° against the direction of the arrow, the said rotary movement being, of course, accurately followed by the pushing gearwheel 31 (position 31" in FIG. 1).

When the button is depressed, first the position of the drive gearwheel 33 which is denoted in FIG. 2 by the solid line arises, without this gearwheel being rotated, and the position of the latch 27 will be as is denoted by solid lines in FIG. 1; the pushing gearwheel 31 — like the gearwheel 33 not subjected to rotation — then still occupies the rotary position 31" which is denoted by the broken line. When the button 1 depressed further, cooperation of the drive gearwheel 33 and the rearmost cam 41 causes rotation of the pushing gearwheel in the described manner in the direction of the arrow, from the position 31" (denoted by the broken line) to the position 31 (denoted by the solid line in FIG. 1), but without the latch 27 being laterally shifted; this means that the bar 13 is engaged and taken along by the latch 27.

During this slide-in movement of the bar 13, the friction between the two bars 13 and 15 causes the latter to be also taken along, notably with a given lead with respect to the bar 13 which is denoted by a bracket 61 in FIG. 1. This lead disappears only after the relevant semi-circular disc has abutted against the said trip, has taken over the position of the latter and has been fixed in the assumed position by further depression. By means of the described device it is achieved, for example, when a different station is to be set on the right-hand drive rod 13, 15, that after the pulling out and the redepression of the button the same drive rod is indeed pushed in (taken along) for the second time by the button and that not, as is normally the case, an automatic mechanical change-over to the other drive rod is effected.

If the directions for use are not accurately followed, it may occur that, after the described pulling out and redepression of the button, the further depression of the button which is required so as to eliminate the lead 61 is not completely effected so that a small lead 61' remains. After the button has been released, it springs back slightly further than the rest position shown in FIG. 1, but the deviation with respect thereto is so small that during the springing back the slide gearwheel 31 is not rotated through 60° against the direction of the arrow. When the button 1 is depressed again, the latch 27 is normally displaced to the left to the position 27' and the left-hand drive rod 9, 11 is taken along, but upon the next depression the latch 27 which is displaced to the right again abuts laterally against the slide 13 which is situated too far forwards over the distance 61'.

In order to prevent this phenomenon with certainty, according to the invention a modified drive pawl is used which is illustrated in the FIGS. 4 to 6. This drive pawl 71 has a frame-like or trough-like shape and comprises two parallel "pawl-arms" 73 and 75 between which a gap or slot 77 is situated, the width of said slot being such that each time two teeth of the gearwheel can engage each of the sides 70 and 81 of the slot (with a small clearance). Consequently, the gearwheel cannot involuntarily rotate as long as it is situated in the slot 77. Rotation becomes possible only after the gearwheel arrives in the region of a recess 83 which is formed in the side 79.

A U-shaped extension 85 is formed on the drive pawl 71. Both legs of the U-shaped extension are provided with cams 87 and 89 on the inner side. The bottom portion of the U-piece 85 is inserted through an opening of sufficient width of the frame 7, and a cavity 93 is provided on the side of the bottom which is remote from the legs, a pressure spring, i.e. a bent leaf spring 95, engaging in said cavity. The other end 97 of the leaf spring rests against the frame 7.

In the situationn shown in FIG. 4 (button rod 3 pushed in) the cam 87 abuts against the front 99 of the frame 7. The drive pawl 71 is pivotable about a pivot 101, which is formed at the point where the cam 87 abuts against the front 99 of the frame. The leaf spring 95 presses the side of the bottom portion of the U-shaped extension 85 adjacent the legs against the edge of the recess in the frame 7 through which the bottom is inserted. In this position, the side 79 of the slot 77 presses against the teeth 45 of the gearwheel 33. In the position in which the gearwheel 33 is pressed in furthest, the upper tooth 45 can still engage in a cavity 109 which is specially provided for this purpose. While FIG. 4 shows the position of the gearwheel 33 opposite to the drive pawl 71 when the pushbutton is depressed, the button rod has been returned to the rest position by the associated spring 5 (see FIG. 1) in the situation shown in FIG. 5. The gearwheel 33 then remains in the region of the recess 83, and the side 79 in this region of the gap is now pressed against the gearwheel. When the pushbutton is depressed again, the gearwheel 33 is rotated through 60°. The latch 27 is then slid out of one drive rod (for example, 9, 11) by the pushing gearwheel 31 and is slid into the other drive rod (13, 15).

Changing of the preselection is effected in this case in the same way as before, that is after the pushbutton rod has been pulled out. In contrast with the device shown in FIG. 1, in this case there is no rotation of the gearwheel 33 (in opposite sense) during the pulling out of the button rod. As is shown in FIG. 6, a catch 111 is connected to the pushbutton rod 3. By means of this catch, which abuts against a projection 113 on the pawl 71 during pulling out, the drive pawl 71 is pulled away from the frame 7 over some distance. This pulling away causes the cam 89 to be pulled against the rear 115 of the frame 7. A new pivot 117 then arises about which the drive pawl 71 can rotate. Because the leaf spring 95 between the cams 87 and 89 presses against the ridge 91 of the U-shaped element 87, the pressure point of the leaf spring 95 is displaced (compare FIGS. 5 and 6) from a location before the frame 7 to a location behind the frame 7. This means that the drive pawl is now urged to rotate in the opposite direction by the spring 95 and that the edge 81 of the drive pawl 71 is pressed against the gearwheel 33.

FIG. 6 shows that when the pulled-out button rod is pressed in, the gearwheel slides into the slot 77 without rotation, so that the catch (27 in FIG. 1) is not displaced to the left with the result that it takes along the same button rod (13, 15 in FIG. 1) again. Consequently, the preselection (including the fixing of the semi-circular disc) can be effected in the same manner as already described. Before the end of the push-in movement, the gearwheel 33 arrives at the closed rearmost end of the slot 77 and by further pushing in the pawl 71 is taken along backwards until at the very end of the push-in movement the situation is reached (compare FIG. 4) in which the pawl 71 is rotated counterclockwise ("tripped") again by the spring 95, so that when the button rod is released (FIG. 5) and pushed in again, the gearwheel 33 is rotated and the latch 27 is slid into the other drive rod.

Obviously, it may occur in this case as well that the pulled-out button rod is not sufficiently pushed through with the result that a given "lead" 61' (see Fig. 1) remains. However, the "tripping" of the pawl 71 takes place only after an accurately determined pushed-in state has been reached; this state can be selected such that the slight lead 61' which is still present can no longer cause a disturbance.

Figure 7:
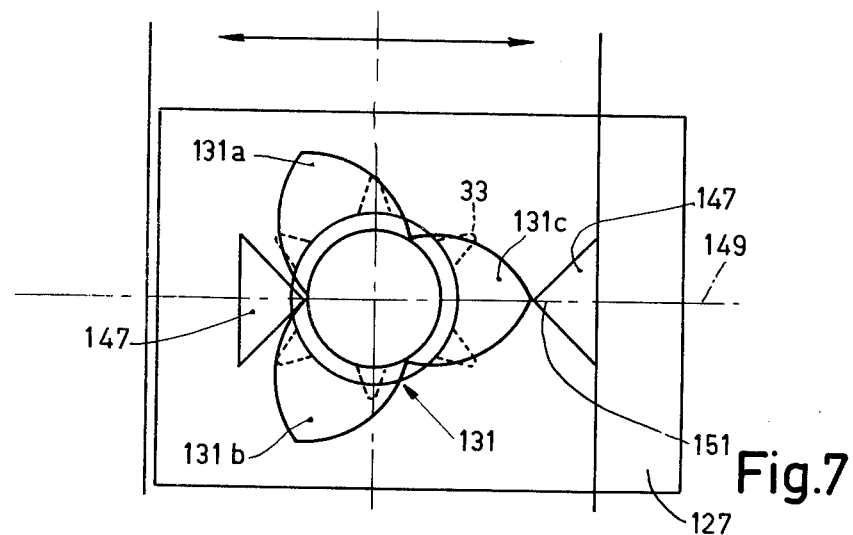
Figure 8:
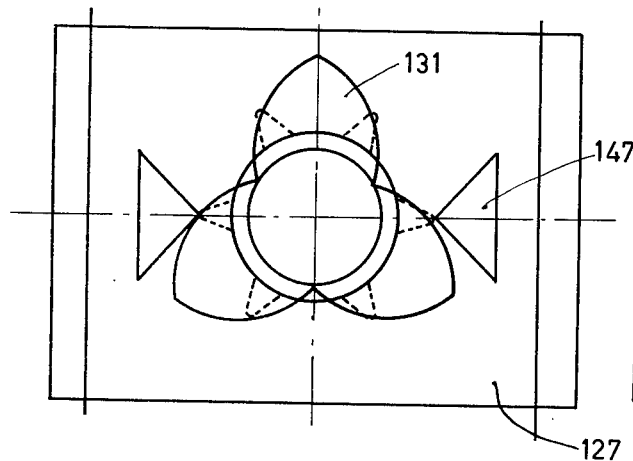
Figure 9:
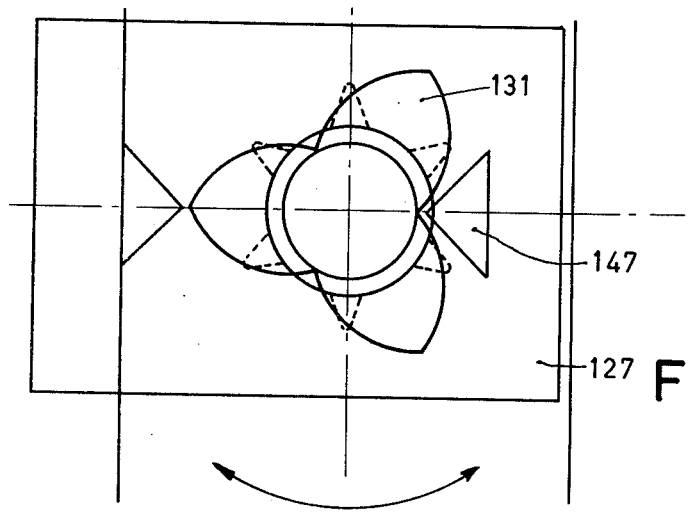

FIGS. 7–9 show a variant of the latch 27 of FIG. 1. This figure shows that the latch is not locked against undesired shifts (to the left in FIG. 1) which might be caused, for example, by vibrations. When a drive pawl according to the FIGS. 4–6 is used, the latch 27 and the pushing gearwheel 31 of FIG. 1 can be replaced by the latch 127 and the pushing gearwheel 131 according to the FIGS. 7–9. The latch 127 is provided with slightly pointed cams 147 which cooperate with the pushing gearwheel and which are provided on a line 149 through the gearwheel shaft at right angles to the drive rods 9, 11 and 13, 15 of FIG. 1. The tips 151 of the cams 147 which are active during displacement and which face each other are then situated exactly on the connection line 149. The tooth flanks of the pushing gearwheel 131 are preferably of evolute curve shape. When three teeth 131a, 131b and 131c are used, the latch is slid, upon rotation of the gearwheel through 60°, from the position shown in FIG. 7, via the center position according to FIG. 8 to the opposite position shown in FIG. 9. As is shown in the FIGS. 7, 8 and 9, flank portions of the teeth 131a to 131c engage the tips 151 of the cams 147 in any rotary position of the gearwheel. Consequently, undesired sliding of the latch, i.e., without simultaneous rotation of the gearwheel, is impossible. However, this latch cannot be used in combination with the drive pawl according to FIG. 2 because that configuration requires that oppositely directed rotation of the gearwheel 33 be possible without sliding of the latch.

What is claimed is:

1. A pushbutton assembly of the type having reset, normal, and depressed positions, in which movement of the pushbutton from the normal to the depressed position moves one of a plurality of members to an operating position, comprising sequencing means for selecting the member to be moved upon sequential depressions of the pushbutton, and means for disabling said sequencing means upon movement of the pushbutton to the reset position, such that the most recently selected member remains selected, and for restoring sequencing for subsequent depressions only upon depression of the pushbutton substantially fully to the depressed position.

2. A pushbutton assembly as claimed in claim 1 comprising a frame means for mounting at least first and second drive members alternately drivable by a pushbutton depressible from a normal position to a depressed position, and movable in an opposite direction from the normal position to a reset position, and wherein said sequencing means comprises a changing catch controlled by said pushbutton for coupling to said drive members, said catch being movable between first and second positions for engaging the first drive member and the second drive member respectively, a rotary member connected to said pushbutton for movement therewith, said rotary member having means for engaging said catch to move it between said positions in response to rotation of said rotary member, and a driven member, and pawl means for engaging said driven member so that said rotary member rotates in response to depression of said pushbutton; wherein said frame means comprises a spring support portion and a pivot portion; said pawl means comprises a drive pawl having a spring engaging surface, a guide slot having two long walls, one long wall having a recess therein at a region in said slot, said recess having a driven means engaging surface; and said means for disabling and restoring comprises normal and reset pivot surfaces on said pawl arranged approximately in the longitudinal direction of said slot, said driven member being disposed within said slot so as to permit longitudinal motion of said pawl without rotation of said driven member, said driven member being rotatable only when in said region, means for moving said pawl longitudinally from a normal position to a reset position in response to movement of said pushbutton to the reset position, means for moving said pawl to the normal position in response to movement of said button to the depressed position, and a pivot spring arranged between said spring support portion and said spring engaging surface for applying spring force therebetween such that in the normal position of said pawl said normal pivot bears against said frame pivot portion and said spring force biases the pawl pivotally such that said long wall having the recess bears against said driven means, said driven means being rotated by said engaging surface upon movement of said pushbutton from the normal toward the depressed positions; in the reset position of said pawl, said reset pivot bears against said frame pivot portion and said spring force biases the pawl pivotally such that the other long wall bears against said driven means, such that movement of said pushbutton only partly from the normal to the depressed position does not rotate the driven means and does not return said pawl to the normal position.

3. A pushbutton assembly as claimed in claim 2, wherein the pawl has a pivot recess formed therein, having an elongated bottom and ends, the ends being said pivot surfaces, the frame comprises a frame portion having adjacent front, rear and edge surfaces, said spring urging said bottom of said pivot recess against said edge surface, longitudinal motion of said pawl bringing a corresponding pivot surface into contact with said front and rear surfaces.

4. A pushbutton assembly as claimed in claim 3, wherein said pivot recess is located beyond an end of said slot remote from said recess region, extending longitudinally in the same direction as the slot, said spring being a compression spring pressing against a side of the pawl opposite said pivot recess.

5. A pushbutton assembly as claimed in claim 2, said pawl comprising a projection, and said pushbutton comprising means for engaging said projection to move said pawl longitudinally to said reset position when said pushbutton is moved to said reset position and to move said pawl to said normal position only when said pushbutton is moved substantially to the depressed position.

6. A pushbutton assembly as claimed in claim 5, wherein the means for engaging said catch comprise at least three radially extending teeth, said catch having an inner surface substantially continuously engaging flanks of said teeth along a line through the axis of said rotary member and perpendicular to the longitudinal direction of said slot.

7. A pushbutton assembly as claimed in claim 1, wherein said means for disabling and restoring comprises a bistable pawl and spring combination, said combination comprising a pawl, means for mounting said pawl for movement from a normal position to a reset position upon movement of the pushbutton to the reset position and for movement from the reset to the normal position only upon depression of the pushbutton to the depressed position, a spring, and means for mounting said spring for bistable positioning to provide bias force holding the pawl in the normal and reset positions.

* * * * *